(12) United States Patent
Lym et al.

(10) Patent No.: US 8,854,907 B2
(45) Date of Patent: Oct. 7, 2014

(54) SEMICONDUCTOR DEVICE FOR SUPPLYING AND MEASURING ELECTRIC CURRENT THROUGH A PAD

(75) Inventors: Sang Kug Lym, Icheon-si (KR); Dong Keun Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 49 days.

(21) Appl. No.: 13/590,648

(22) Filed: Aug. 21, 2012

(65) Prior Publication Data
US 2013/0322164 A1 Dec. 5, 2013

(30) Foreign Application Priority Data

May 31, 2012 (KR) ........................ 10-2012-0058230

(51) Int. Cl.
*G11C 7/00* (2006.01)
(52) U.S. Cl.
USPC ........................ 365/201; 365/189.17; 365/205
(58) Field of Classification Search
USPC ..................................... 365/189.17, 201, 205
See application file for complete search history.

(56) References Cited

U.S. PATENT DOCUMENTS

| | | | | |
|---|---|---|---|---|
| 5,559,741 | A | * | 9/1996 | Sobue ........................... 365/200 |
| 6,275,961 | B1 | * | 8/2001 | Roohparvar .................. 714/718 |
| 6,421,291 | B1 | * | 7/2002 | Watanabe et al. ............. 365/219 |
| 2002/0006066 | A1 | * | 1/2002 | Kim ............................... 365/201 |
| 2002/0024879 | A1 | * | 2/2002 | Tsuji et al. ..................... 365/233 |
| 2009/0097336 | A1 | * | 4/2009 | Kang et al. ................. 365/189.14 |
| 2009/0154243 | A1 | * | 6/2009 | Ohtake ..................... 365/185.11 |
| 2010/0296349 | A1 | * | 11/2010 | Yoon ........................ 365/189.14 |
| 2010/0302841 | A1 | * | 12/2010 | Kim et al. ...................... 365/163 |
| 2012/0257461 | A1 | * | 10/2012 | Kim et al. ................ 365/189.05 |
| 2013/0114326 | A1 | * | 5/2013 | Lee ................................ 365/148 |

FOREIGN PATENT DOCUMENTS

KR 100671752 B1 1/2007

* cited by examiner

*Primary Examiner* — Hoai V Ho
(74) *Attorney, Agent, or Firm* — William Park & Associates Patent Ltd.

(57) ABSTRACT

The present invention relates to a semiconductor device, and more particularly, to a semiconductor memory device capable of supplying and measuring an electric current through a pad. The semiconductor device includes a memory cell, a data pad configured to receive data to be programmed into the memory cell or a write current to be supplied to the memory cell from an external device, and output data read out from the memory cell or a cell current flowing from the memory cell to the external device, and a path switching unit configured to set up a path so that the memory cell and the data pad are directly coupled when a test operation is performed.

12 Claims, 6 Drawing Sheets

SEMICONDUCTOR DEVICE FOR SUPPLYING AND MEASURING ELECTRIC CURRENT THROUGH A PAD

CROSS-REFERENCES TO RELATED APPLICATION

The present application claims priority under 35 U.S.C. §119 (a) to Korean application number 10-2012-0058230, filed on May 31, 2012, in the Korean Intellectual Property Office, which is incorporated herein by reference in its entirety.

BACKGROUND

1. Technical Field

The present invention generally relates to a semiconductor device, and to a semiconductor memory device capable of supplying and measuring an electric current through a pad.

2. Related Art

In general, a semiconductor memory device is classified into a volatile memory device and a nonvolatile memory device. The volatile memory device loses data stored therein when power is cut off, whereas the nonvolatile memory device retains data stored therein even though power is cut off.

The nonvolatile memory device includes various types of memory cells. Depending on the structures of the memory cells, the nonvolatile memory device may be classified into a flash memory device, ferroelectric RAM (FRAM) using a ferroelectric capacitor, magnetic RAM (MRAM) using a tunneling magneto-resistive (TMR) layer, and a semiconductor memory device using chalcogenide alloys. Particularly, the semiconductor memory device is a nonvolatile memory device using a phase change, that is, a resistance change, according to a temperature change. For this reason, the semiconductor memory device is also called a variable resistance memory device.

The memory cell of the semiconductor memory device is made of a calcogen compound, that is, phase change materials, for example, a germanium (Ge)-antimony (Sb)-tellurium (Te) mixture (GST) (hereinafter referred to as "GST materials"). The GST materials have an amorphous state indicative of relatively high resistivity and a crystalline state having relatively low resistivity. The memory cell of the semiconductor memory device may store data "1" corresponding to the amorphous state and data "0" corresponding to the crystalline state. When the GST materials are heated, data corresponding to the amorphous state or the crystalline state is programmed into the memory cell of the semiconductor memory device. For example, the amorphous state or crystalline state of the GST materials may be controlled by controlling the amount of current for heating the GST materials and the time that it takes to supply the current.

As described above, the state of a memory cell of the phase change memory device is changed depending on a write current supplied to the memory cell. Furthermore, the state of a memory cell of the phase change memory device is determined depending on how much the memory cell can conduct current supplied thereto. In the write operation of the phase change memory device, if a write current is shifted by the influence of a write driver and peripheral circuits, memory cells may have an unexpected resistance distribution. In the read operation of the phase change memory device, if a sensing current is shifted by the influence of a sense amplifier and peripheral circuits, a resistance distribution of memory cells may not be precisely detected. For the reasons, a problem arises because a test in the memory cells may not be precisely performed.

Accordingly, there is a need for a scheme capable of supplying a write current to a memory cell or detecting the sensing current of a memory cell without the influence of relevant circuits in the test operation of a phase change memory device.

SUMMARY

Various embodiments relate to a semiconductor device capable of supplying and measuring an electric current through a pad.

In an embodiment, a semiconductor device includes a memory cell, a data pad configured to receive data to be programmed into the memory cell or a write current to be supplied to the memory cell from an external device and output data read out from the memory cell or a cell current flowing from the memory cell to the external device, and a path switching unit configured to set up a path so that the memory cell and the data pad are directly coupled when a test operation is performed.

In an embodiment, a semiconductor device includes a memory cell, a data pad configured to receive data to be programmed into the memory cell or a write current to be supplied to the memory cell and output data read out from the memory cell or output a cell current flowing from the memory cell, and a path switching unit configured to set up a path so that the memory cell and the data pad are directly coupled when a test operation is performed.

BRIEF DESCRIPTION OF THE DRAWINGS

Features, aspects, and embodiments are described in conjunction with the attached drawings, in which.

DETAILED DESCRIPTION

Figure 1:
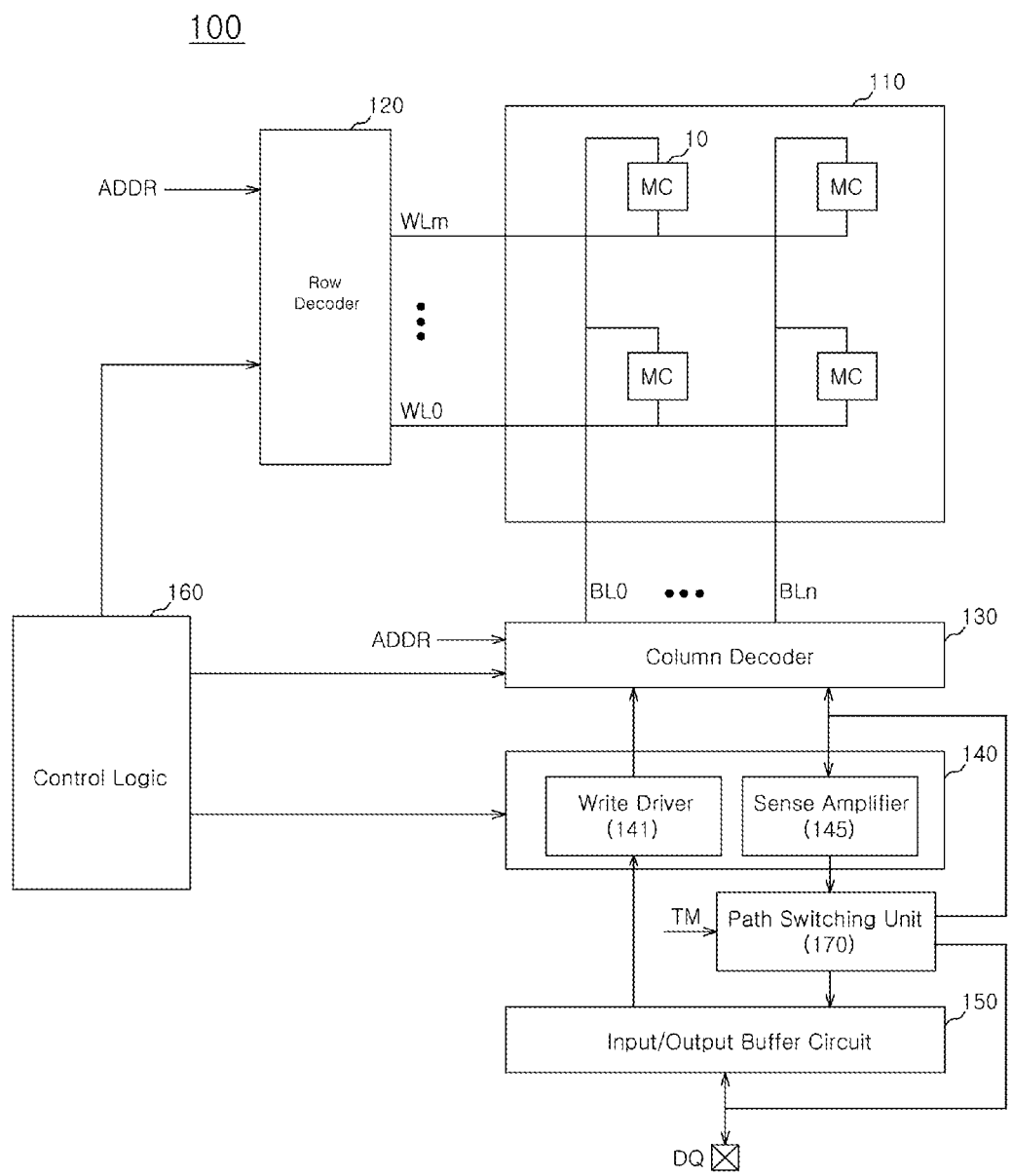
FIG. 1 is a block diagram illustrating an example of a semiconductor memory device according to an embodiment.

Hereinafter, the present invention will be described below with reference to the accompanying drawings through various embodiments. However, the present invention is not limited to the embodiments to be described herein, but may be embodied into other forms. The embodiments are provided to describe the present invention such that the concept of the present invention may be easily understood by those skilled in the art.

In the drawings, the embodiments of the present invention are not limited to illustrated specific forms, but are exaggerated for clarity. In this specification, specific terms are used to describe the present invention, but do not limit the scope of the present invention.

In this specification, terms such as and/or include any item among combinations of a plurality of related items or the plurality of related items. Furthermore, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. The terminology used herein is for the purpose of describing particular embodiments only and is not intended to be limiting of the invention. As used herein, the singular forms are intended to include the plural forms as well, unless the context clearly indicates otherwise. It will be further understood that the terms "comprise", "comprising", "have" and/or "having", when used herein, specify the presence of stated features, integers, steps, operations, elements, and/or components, but do not preclude the presence or addition of one or more other features, integers, steps, operations, elements, components, and/or groups thereof.

FIG. 1 is a block diagram illustrating an example of a semiconductor memory device according to an embodiment. The semiconductor memory device 100 will be described below by taking a phase change memory device using a change of resistance according to a change of temperature, that is, a change of a phase, is as an example.

Referring to FIG. 1, the semiconductor memory device 100 may include a memory cell array 110, a row decoder 120, a column decoder 130, a data read/write circuit 140, an input/output buffer circuit 150, control logic 160, and a path switching unit 170.

The memory cell array 110 may include a plurality of memory cells MC 10 arranged in respective areas where bit lines BL0~BLn cross word lines WL0~WLm. For example, each of the memory cells MC can be formed of a phase change memory cell, including a memory element and a selecting element. This memory cell MC will be described below with reference to FIGS. 5 to 8.

The row decoder 120 may be operated under the control of the control logic 160. The row decoder 120 may be connected to the memory cell array 110 through the word lines WL0~WLm. The row decoder 120 may be configured to decode an external input address ADDR. The row decoder 120 may supply a selected voltage to a selected word line and an unselected voltage to an unselected word line according to the results of decoding.

Figure 2:
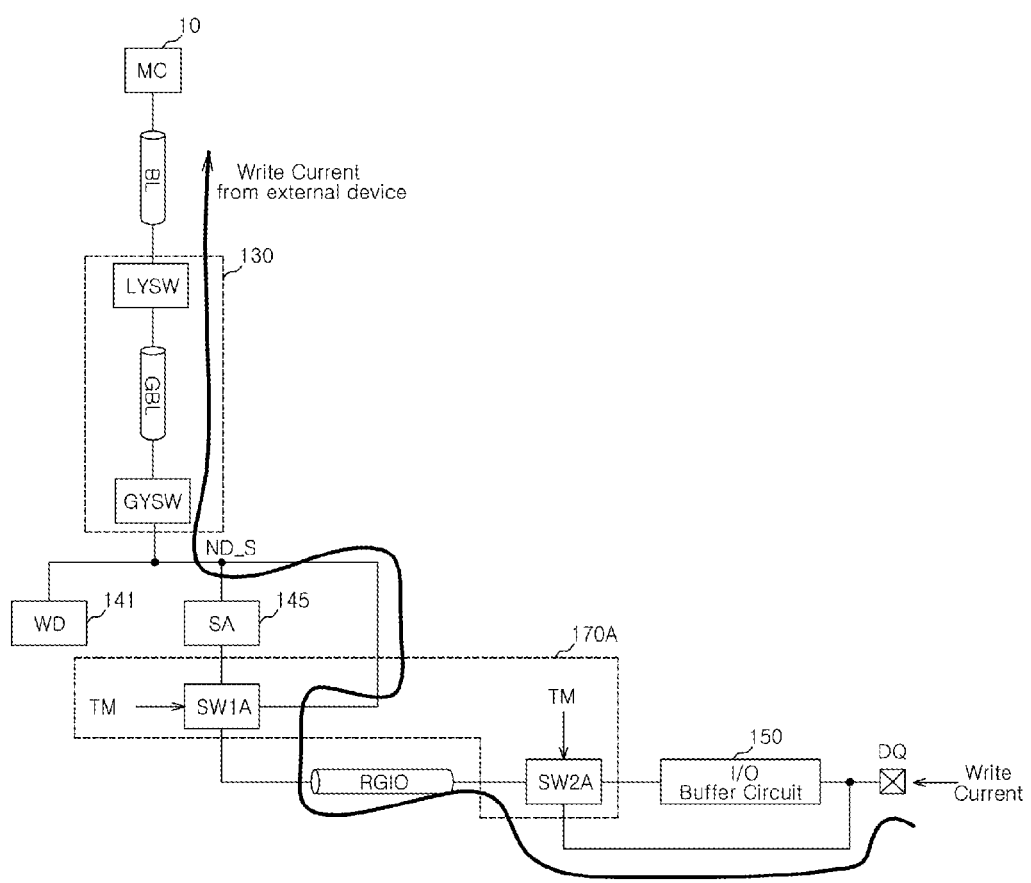
FIG. 2 is a circuit diagram illustrating an example of a method of supplying a write current to a memory cell in a test operation.
Figure 3:
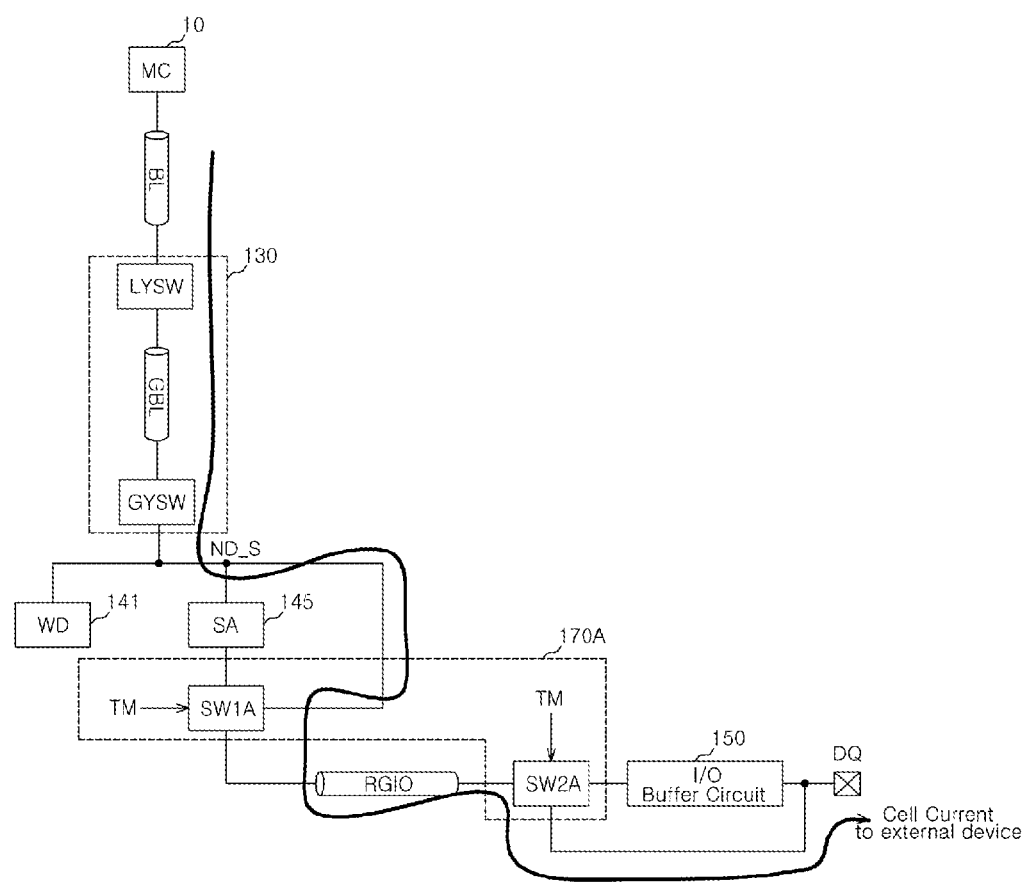
FIG. 3 is a circuit diagram illustrating an example of a method of externally outputting the cell current of a memory cell in a test operation.
Figure 4:
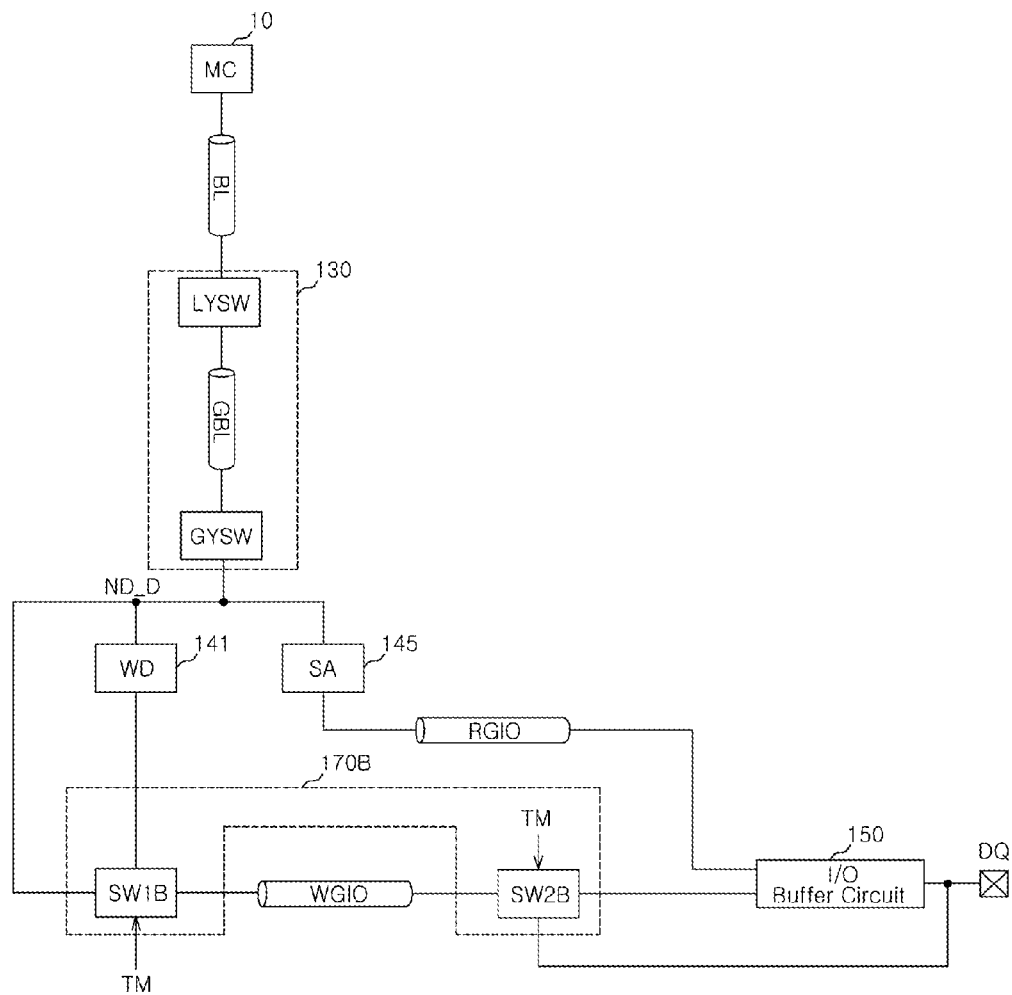
FIG. 4 is a circuit diagram showing a modified example of a path switching unit according to another embodiment.

The column decoder 130 may be operated under the control of the control logic 160. The column decoder 130 may be connected to the memory cell array 110 through the bit lines BL0~BLn. The column decoder 130 may be configured to decode the address ADDR. The column decoder 130 may be configured to electrically couple the bit line BL and the data read/write circuit 140 according to a result of the decoding (i.e., the column decoder may include a local column selecting switch (LYSW) and a global column selecting switch (GYSW) as illustrated in FIGS. 2-4).

The data read/write circuit 140 may be operated under the control of the control logic 160. The data read/write circuit 140 may include a write driver 141 and a sense amplifier 145.

The write driver 141 may be configured to provide a write current to the bit line BL in response to a write driver control signal, for example, a write driver activation signal. For example, the write driver 141 can provide an electric current for programming data "1" or data "0" into a selected memory cell MC.

The write driver 141 may be deactivated while the semiconductor memory device 100 is operating in a test mode. That is, while the semiconductor memory device 100 is operating in a test mode, a write current supplied to the bit line BL may not be supplied to the write driver 141. While the semiconductor memory device 100 is operated in a test mode, the write current supplied to the bit line BL may be supplied through a data pad DQ from the outside. This will be described later below.

The sense amplifier 145 may be configured to read out data stored in a selected memory cell MC in response to a sense amplifier control signal, for example, a sense amplifier activation signal when a read operation or a verify read operation is performed. The sense amplifier 145 may detect a difference between a cell current (or voltage) flowing from a selected memory cell MC and a reference current (or voltage). Furthermore, the sense amplifier 145 may is determine data stored in the memory cell MC based on a result of the detection.

The sense amplifier 145 may be deactivated while the semiconductor memory device 100 is operating in a test mode. That is, while the semiconductor memory device 100 is operating in a test mode, a cell current flowing from a selected memory cell MC may not be detected by the sense amplifier 145. While the semiconductor memory device 100 is operating in a test mode, a cell current flowing from a selected memory cell MC may be externally outputted through the data pad DQ. This will be described later, below.

The input/output buffer circuit 150 may be configured to receive data from an external device (for example, a memory controller, a memory I/F, and a host device) or output data to the external device. To this end, the input/output buffer circuit 150 can include a data latch circuit and an output driving circuit. The input/output buffer circuit 150 may receive data from the outside or output data to the outside through the data pad DQ. Here, the data pad DQ may be a pad for the input and output of data. In accordance with an embodiment, the data pad DQ may be used to receive a write current supplied from the outside or to externally output a cell current flowing from a selected memory cell 10.

The control logic 160 may be configured to control an overall operation of the semiconductor memory device 100 in response to a command provided from the external device. For example, the control logic 160 will control the read, write (or program), and erase operations of the semiconductor memory device 100. As illustrated, if the semiconductor memory device 100 is formed of a phase change memory device, the erase operation may mean an operation of programming a memory cell so that the memory cell has the amorphous state.

The control logic 160 may control the write driver 141 and the sense amplifier 145 in response to a test mode command so that they may be deactivated. The control logic 160 may control the path switching unit 170 in response to a test mode command so that the path switching unit 170 may be activated. To this end, the control logic 160 may provide a path switching unit activation signal TM to the path switching unit 170 when a test operation is performed.

The path switching unit 170 may set up a path so that a write current (or voltage) received through the data pad DQ may be directly supplied to the memory cell MC while the semiconductor memory device 100 may be operated in a test mode. In this case, the path switching unit 170 can set up a path so that the write current (or voltage) received through the data pad DQ may be directly transferred to the memory cell MC without passing through the write driver 141 and the sense amplifier 145. The path switching unit 170 may set up a path so that a cell current flowing from the memory cell MC may be externally outputted through the data pad DQ while the semiconductor memory device 100 may be operated in a test mode. In this case, the path switching unit 170 can set up a path so that the cell current flowing from the memory cell MC may be directly transferred to the data pad DQ without passing through the sense amplifier 145. The construction and operation of this path switching unit 170 will be described below with reference to FIGS. 2 to 4.

FIG. 2 is a circuit diagram illustrating an example of a method of supplying a write current to a memory cell in a test operation. Referring to FIG. 2, a path switching unit 170A may be connected between the sense amplifier 145 and the input/output buffer circuit 150. The path switching unit 170A may include a first switching unit SW1A and a second switching unit SW2A.

The first switching unit SW1A may be connected between the sense amplifier 145 and a global read data line RGIO. Here, the global read data line RGIO may mean a line used for a read operation, from among common global data input/output lines GIO. The first switching unit SW1A may be operated in response to the path switching unit activation signal TM provided when a test operation is performed. The first switching unit SW1A may connect a sense node ND_S and the global read data line RGIO in response to the path switching unit activation signal TM. Here, the sense node ND_S may mean a node at which the bit line BL (or the global a bit line GBL) and the sense amplifier 145 are coupled.

The second switching unit SW2A may be connected between the global read data line RGIO and the input/output buffer circuit 150. The second switching unit SW2A may connect the global read data line RGIO and the data pad DQ in response to the path switching unit activation signal TM.

In accordance with the construction of this path switching unit 170A, a write current supplied through the data pad DQ from the outside can be directly supplied to the memory cell 10 without passing through relevant circuits (that is, the write driver 141, the sense amplifier 145, and the input/output buffer circuit 150). For example, the write current provided through the data pad DQ can be transferred to the global read data line RGIO by the second switching unit SW2A without passing through the input/output buffer circuit 150. Furthermore, the write current transferred to the global read data line RGIO can be transferred to the bit line BL and the memory cell 10 by the first switching unit SW1A without passing through the sense amplifier 145. In accordance with an embodiment, in the test operation of the semiconductor memory device (see 100 of FIG. 1), a write current can be directly supplied to the memory cell 10 without the influence of relevant circuits.

FIG. 3 is a circuit diagram illustrating an example of a method of externally outputting the cell current of a memory cell in a test operation. FIG. 2 illustrates a write test operation, whereas FIG. 3 illustrates a read test operation. Accordingly, the construction illustrated in FIG. 3 will be the same as the construction illustrated in FIG. 2, and thus a detailed description thereof is omitted for simplicity.

Like in FIG. 2, the first switching unit SW1A may couple with the sense node ND_S and the global read data line RGIO in response to the path switching unit activation signal TM. Furthermore, the second switching unit SW2A may couple with the global read data line RGIO and the data pad DQ in response to the path switching unit activation signal TM.

In accordance with the construction of this path switching unit 170A, a cell current flowing from the memory cell 10 can be outputted to the data pad DQ without passing through relevant circuits (that is, the sense amplifier 145 and the input/output buffer circuit 150). For example, a cell current flowing from the memory cell 10 can be transferred to the global read data line RGIO by the first switching unit SW1A without passing through the sense amplifier 145. Furthermore, the cell current transferred to the global read data line RGIO can be transferred to the data pad DQ by the second switching unit SW2A without passing through the input/output buffer circuit 150. In accordance with an embodiment, in the test operation of the semiconductor memory device (see 100 of FIG. 1), a cell current from which the influence of relevant circuits has been excluded can be outputted to the outside.

Additionally, it may be easily understood that an electric current (or voltage) for a read operation can be supplied through the data pad DQ like in a common read operation of the sense amplifier 145 in order to make a cell current flow from the memory cell 10.

FIG. 4 is a circuit diagram showing a modified example of the path switching unit according to another embodiment. Referring to FIG. 4, a path switching unit 170B is connected between the write driver 141 and the input/output buffer circuit 150. The path switching unit 170B may include a first switching unit SW1B and a second switching unit SW2B.

The first switching unit SW1B may be connected between the write driver 141 and a global write data line WGIO. Here, the global write data line WGIO may mean a line used for a write operation, from among common global data input/output lines GIO. The first switching unit SW1B may be operated in response to the path switching unit activation signal TM provided when the test operation is performed. The first switching unit SW1B may connect a driving node ND_D and the global write data line WGIO in response to the path switching unit activation signal TM. Here, the driving node ND_D may mean a node at which the bit line BL (or the global bit line GBL) and the write driver 141 may be coupled.

The second switching unit SW2B may be connected between the write glob al data line WGIO and the input/output buffer circuit 150. The second switching unit SW2B may connect the global write data line WGIO and the data pad DQ in response to the path switching unit activation signal TM.

In accordance with the construction of this path switching unit 170B, a write current provided through the data pad DQ from the outside can be directly supplied to the memory cell 10 without passing through relevant circuits (that is, the write driver 141 and the input/output buffer circuit 150). For example, a write current provided through the data pad DQ can be transferred to the global write data line WGIO by the second switching unit SW2B without passing through the input/output buffer circuit 150. Furthermore, the write current transferred to the global write data line WGIO can be transferred to the bit line BL and the memory cell 10 by the first switching unit SW1B without passing through the write driver 141.

In accordance with the construction of this path switching unit 170B, a cell current flowing from the memory cell 10 can be outputted to the data pad DQ without passing through relevant circuits (that is, the write driver 141, the sense amplifier 145, and the input/output buffer circuit 150). For example, a cell current flowing from the memory cell 10 can be transferred to the global write data line WGIO by the first switching unit SW1B without passing through the write driver 141. Furthermore, the cell current transferred to the global write data line WGIO can be transferred to the data pad DQ by the second switching unit SW2B without passing through the input/output buffer circuit 150.

In accordance with an embodiment of the present invention, in the test operation of the semiconductor memory device (see 100 of FIG. 1), a write current can be directly supplied to the memory cell without the influence of relevant circuits. Furthermore, in the test operation of the semiconductor memory device 100, a cell current from which the influence of relevant circuits has been excluded can be outputted to the outside.

Figure 5:
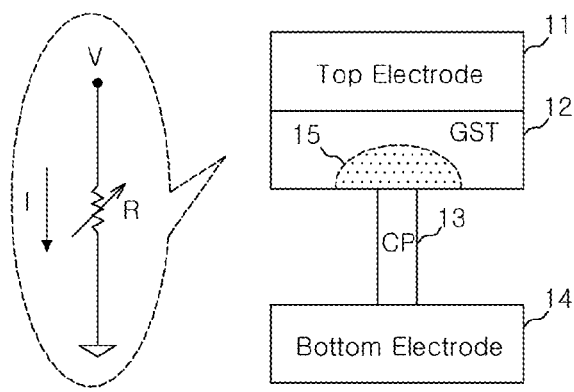
FIG. 5 is a diagram illustrating the memory element of a memory cell illustrated in FIG. 1.

FIG. 5 is a diagram illustrating the memory element of the memory cell illustrated in FIG. 1. The memory cell of the is semiconductor memory device (see 100 of FIG. 1) may include the memory element and the selecting element. A schematic diagram of the memory element of the memory cell is illustrated in FIG. 5.

The memory element 16 may have a variable resistance value depending on a received current I. For this reason, the memory element 16 may also be called a resistance element. A cross section of the memory element 16 is described below. The memory element 16 may include a top electrode 11, GST materials 12, a contact plug (CP) 13, and a bottom electrode 14.

The top electrode 11 may be connected to the bit line BL. The bottom electrode 14 may be connected between the CP 13 and the selecting element (not illustrated). The CP 13 may be made of conductive materials (for example, TiN). The CP 13 may also be called a heater plug. The GST materials 12 may be formed between the top electrode 11 and the CP 13.

A phase of the GST materials 12 may change the amount of supplied current and the time that it takes to supply the current. A phase of the GST materials 12 corresponding to the reset state or set state may be determined by an amorphous volume 15 as illustrated. The amorphous volume 15 may be reduced from the amorphous state toward the crystalline state. The amorphous state may correspond to the reset state, and the crystalline state may correspond to the set state. The GST materials 12 may have a variable resistance value depending on the amorphous volume 15. That is, written data may be determined by the amorphous volume 15 of the GST materials 12 that may be formed depending on a supplied current.

Figure 6:
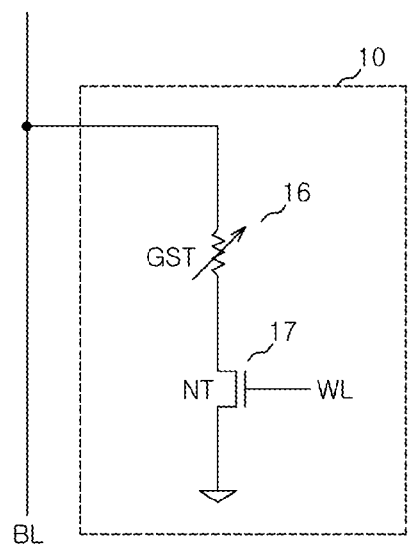
FIGS. 6 and 7 are circuit diagrams illustrating the memory cell illustrated in FIG. 1.
Figure 7:
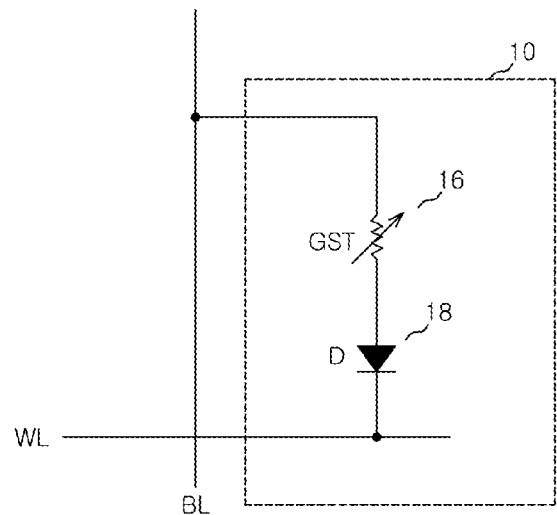

FIGS. 6 and 7 are circuit diagrams illustrating the memory cell illustrated in FIG. 1. FIG. 6 illustrates an example of a phase change memory cell including a MOS switch type selecting element, and FIG. 7 illustrates an example of a phase change memory cell including a diode switch type selecting element.

Referring to FIG. 6, the memory cell 10 may include a memory element 16 and a selecting element 17. The memory element 16 may be connected between the bit line BL and the selecting element 17. The selecting element 17 may be connected between the memory element 16 and a ground GND. The word line WL may be connected to the gate of the selecting element 17. Although the memory element 16 is illustrated as being connected between the bit line BL and the selecting element 17 in FIG. 6, it will be easily understood that the selecting element 17 can be connected between the bit line BL and the memory element 16.

The memory element 16 has the same configuration as the memory element illustrated in FIG. 5 and performs the same operation as the memory element illustrated in FIG. 5, and thus a description thereof will be omitted.

The selecting element 17 may be formed of an NMOS transistor NT. When a specific voltage is supplied to the word line WL in order to select the memory cell 10, the NMOS transistor NT may be turned on. When the NMOS transistor NT is turned on, the memory is element 16 may receive an electric current through the bit line BL.

Referring to FIG. 7, the memory cell 10 may include a memory element 16 and a selecting element 18. The memory element 16 may be connected between the bit line BL and the selecting element 18. The selecting element 18 may be connected between the memory element 16 and the word line WL.

The memory element 16 has the same configuration as the memory element illustrated in FIG. 5 and performs the same operation as the memory element illustrated in FIG. 5, and thus a description thereof will be omitted.

The selecting element 18 may be formed of a diode D. The memory element 16 may be connected to the anode of the diode D, and the word line WL may be connected to the cathode of the diode D. When a ground voltage GND is supplied to the word line WL in order to select the memory cell 10, a voltage difference between the anode and the cathode of the diode D may be changed. When a voltage difference between the anode and the cathode of the diode D is greater than a threshold voltage of the diode D, the diode D may be turned on. When the diode D is turned on, an electric current may be supplied to the memory element 16 through the bit line BL.

Figure 8:
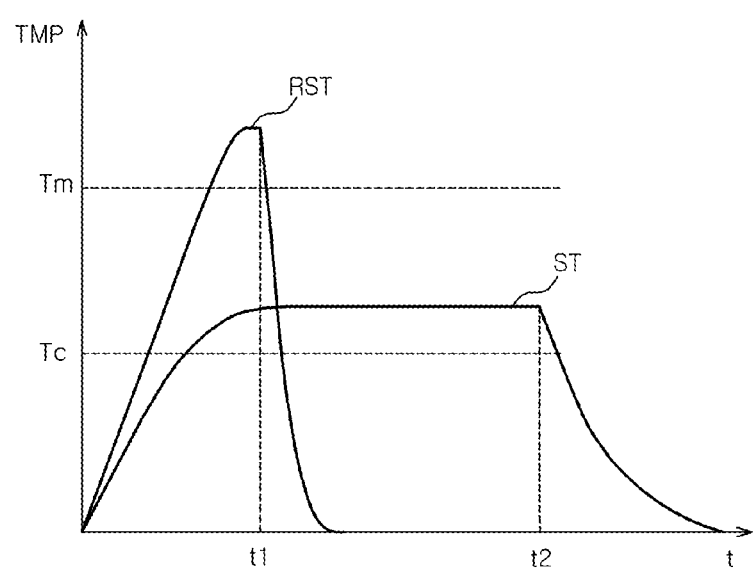
FIG. 8 is a graph illustrating the characteristics of GST materials illustrated in FIG. 5.

FIG. 8 is a graph illustrating the characteristics of the GST materials illustrated in FIG. 5. In FIG. 8, reference numeral 'RST' indicates a condition that a phase of the GST materials becomes the amorphous state (that is, the reset state). Furthermore, reference numeral 'ST' indicates a condition that a phase of the GST materials becomes the crystalline state (that is, the set state).

When the GST materials are heated to a higher temperature than the melting temperature Tm during a time t1 and then rapidly quenched, a phase of the GST materials changes into the amorphous state. When a phase of the GST materials changes into the amorphous state, the memory cell (see 100 of FIG. 1) may store data "1". In contrast, when the GST materials are heated to a higher temperature than the crystallization temperature Tc during a time t2 longer than the time t1 and then slowly quenched, a phase of the GST materials changes into the crystalline state. Here, the crystallization temperature Tc is lower than the melting temperature Tm. When a phase of the GST materials changes into the crystalline state, the memory cell 10 may store data "0".

In accordance with the embodiments of the present invention, a write current can be supplied to a memory cell or a sensing current of a memory cell can be detected without the influence of relevant circuits.

While certain embodiments have been described above, it will be understood to those skilled in the art that the embodiments described are by way of example only. Accordingly, the semiconductor memory device described herein should not be limited to the described embodiments. Rather, the semiconductor memory device described herein should only be limited in light of the claims that follow when taken in conjunction with the above description and accompanying drawings.

What is claimed is:
1. A semiconductor device, comprising:
a memory cell;
a data pad configured to receive data to be programmed into the memory cell or a write current to be supplied to the memory cell and output data read out from the memory cell or a cell current flowing from the memory cell;

a sense amplifier configured to read out data stored in the memory cell;

an input/output buffer circuit configured to buffer data received through the data pad or drive a signal outputted through the data pad; and a path switching unit connected between the sense amplifier and the input/output buffer circuit, and configured to set up a path so that the memory cell and the data pad are directly coupled when a test operation is performed, and wherein the sense amplifier and the input/output buffer circuit are coupled through a global read data line, and wherein the path switching unit comprises:
- a first switching unit connected between the sense amplifier and the global read data line; and
- a second switching unit connected between the global read data line and the input/output buffer circuit.

2. The semiconductor device according to claim 1, wherein:

the first switching unit sets up a path so that the memory cell and the global read data line are directly coupled when a test operation is performed, and the second switching unit sets up a path so that the global read data line and the data pad are directly coupled when a test operation is performed.

3. The semiconductor device according to claim 2, wherein the write current received from the external device is directly supplied to the memory cell when a write test operation is performed.

4. The semiconductor device according to claim 3, further comprising a write driver configured to supply the write current to the memory cell, wherein the write driver is deactivated when the write test operation is performed.

5. The semiconductor device according to claim 2, wherein the cell current is directly outputted to an external device through the data pad when a read test operation is performed.

6. The semiconductor device according to claim 5, wherein the sense amplifier is deactivated when the read test operation is performed.

7. A semiconductor device comprising:

a memory cell;

a data pad configured to receive data to be programmed into the memory cell or a write current to be supplied to the memory cell and output data read out from the memory cell or a cell current flowing from the memory cell;

a write driver configured to supply the write current to the memory cell;

an input/output buffer circuit configured to buffer data received through the data pad or drive a signal outputted through the data pad; and a path switching unit connected between the write driver and the input/output buffer circuit, and configured to set up a path so that the memory cell and the data pad are directly coupled when a test operation is performed, wherein the write driver and the input/output buffer circuit are coupled through a global write data line, and wherein the path switching unit comprises a first switching unit connected between the write driver and the global write data line and a second switching unit connected between the global write data line and the input/output buffer circuit.

8. The semiconductor device according to claim 7, wherein:

the first switching unit sets up a path so that the memory cell and the global write data line are directly coupled when a test operation is performed, and the second switching unit sets up a path so that the global write data line and the data pad are directly coupled when a test operation is performed.

9. The semiconductor device according to claim 8, wherein the write current received from an external device is directly supplied to the memory cell when a write test operation is performed.

10. The semiconductor device according to claim 9, wherein the write driver is deactivated when a write test operation is performed.

11. The semiconductor device according to claim 8, wherein the cell current is directly outputted to an external device through the data pad when a read test operation is performed.

12. The semiconductor device according to claim 11, further comprising a sense amplifier configured to read out data stored in the memory cell, wherein the sense amplifier is deactivated when the read test operation is performed.

* * * * *